(12) United States Patent
Hong (10) Patent No.: US 8,563,432 B2
(45) Date of Patent: Oct. 22, 2013

(54) METHOD FOR FORMING THROUGH SILICON VIA STRUCTURE

(75) Inventor: Zhongshan Hong, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 24 days.

(21) Appl. No.: 13/304,268

(22) Filed: Nov. 23, 2011

(65) Prior Publication Data

US 2012/0276738 A1 Nov. 1, 2012

(30) Foreign Application Priority Data

Apr. 28, 2011 (CN) .......................... 2011 1 0109844

(51) Int. Cl.
*H01L 21/44* (2006.01)
*H01L 21/4763* (2006.01)

(52) U.S. Cl.
USPC ........... 438/672; 438/629; 438/637; 438/654; 257/E21.585

(58) Field of Classification Search
USPC ......... 438/629, 637, 654, 668, 672, 675, 586, 438/597, 598, 602–604, 618, 620, 621, 666
See application file for complete search history.

(56) References Cited

U.S. PATENT DOCUMENTS

| 6,696,222 B2 * | 2/2004 | Hsue et al. ................... 430/313 |
| 2009/0256251 A1 * | 10/2009 | Getz et al. ................... 257/698 |
| 2010/0224966 A1 * | 9/2010 | Chen .............................. 257/621 |
| 2010/0314758 A1 * | 12/2010 | Wu et al. ....................... 257/737 |
| 2011/0316166 A1 * | 12/2011 | Yu et al. ........................ 257/774 |

FOREIGN PATENT DOCUMENTS

CN  101924096 A  12/2010

* cited by examiner

*Primary Examiner* — Calvin Choi
(74) *Attorney, Agent, or Firm* — Anova Law Group, PLLC (57) ABSTRACT

A method for forming a TSV structure includes providing a silicon substrate with an interlayer dielectric layer formed thereon, forming a hard mask structure including a first hard mask layer including a metal element on the interlayer dielectric layer and a second hard mask layer on the first hard mask layer; forming an opening through the hard mask structure and the interlayer dielectric layer, the opening has a bottom and sidewalls in the silicon substrate. The method further includes depositing an insulating material on the hard mask structure and on the bottom and the sidewalls of the opening, subsequently removing the insulating material and the second hard mask layer until the first hard mask layer is exposed, and filling a conductive material into the opening. The method also includes removing the conductive material and the first hard mask layer by a CMP process until the interlayer dielectric layer is exposed.

12 Claims, 7 Drawing Sheets

METHOD FOR FORMING THROUGH SILICON VIA STRUCTURE

CROSS-REFERENCES TO RELATED APPLICATIONS

The present application claims priority to Chinese Patent Application No. 201110109844.6, entitled "Method for Forming Through Silicon Via Structure", filed on Apr. 28, 2011, the entire disclosure of which is incorporated herein by reference.

FIELD OF THE INVENTION

The present invention generally relates to the field of semiconductor manufacturing, and more particularly, to a method for forming a through silicon via structure.

BACKGROUND OF THE INVENTION

With the rapid development of semiconductor manufacturing technology, more semiconductor devices need to be integrated in one chip in order to obtain a faster operating speed, a larger memory space and more functions. With the increasing integration of devices in semiconductor chips, the critical dimensions of the devices are getting smaller.

The conventional integrated circuit (IC) packaging technique applies bonding wires and bonding pads to obtain electrical interconnection of the chips, which may enlarge the sizes of packages. Therefore, the through silicon via (TSV) technique, which is a new 3D packaging technology, is developed to obtain a 3D chip stacking structure that provides higher packaging density to reduce the packaging sizes. The TSV technique can also increase the operating speed of the chips and reduce the power consumption thereof.

Figure 1:
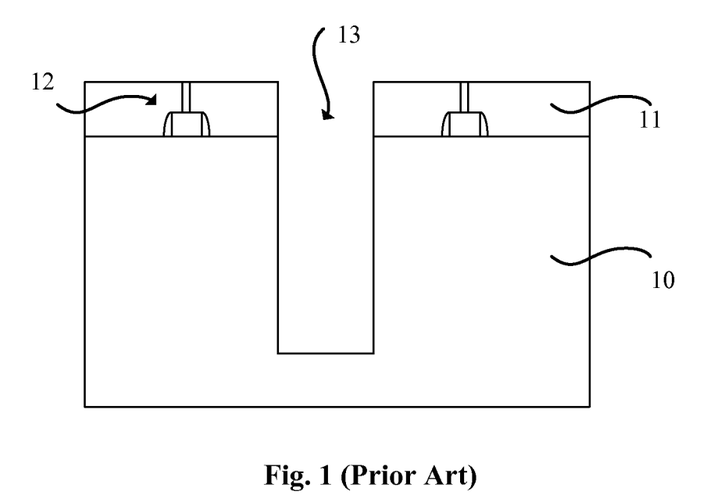
FIGS. 1 to 4 are schematic cross-sectional views of intermediate structures of a TSV structure formed by a conventional TSV technique.

By applying the TSV technique, a TSV structure is formed to vertically interconnect the chips or wafers. FIGS. 1 through 4 are schematic cross-sectional views of intermediate structures of a TSV structure formed by a conventional TSV technique. Referring to FIG. 1, a plurality of MOS transistors 12 are formed on a surface of a silicon substrate 10, an interlayer dielectric layer 11 is formed on the MOS transistors, and an opening 13 is formed through the interlayer dielectric layer 11 and in the substrate 10. The opening 13 has a bottom and sidewalls in the silicon substrate 10.

Figure 2:
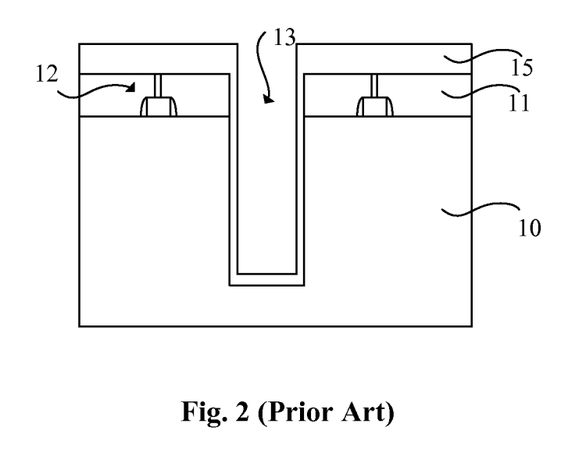
Figure 3:
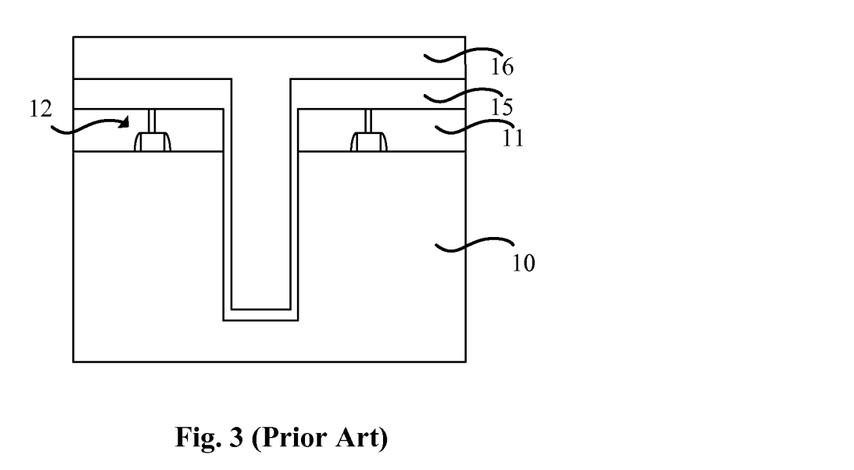

Thereafter, a silicon oxide layer 15 is formed by depositing silicon oxide material on the bottom and the sidewalls of the opening 13, and on the interlayer dielectric layer 11, as shown in FIG. 2. Thereafter, referring to FIG. 3, a copper layer 16 is formed by depositing a copper material until the copper completely fills the opening 13 and covers the silicon oxide layer 15. Thereafter, referring to FIG. 4, a portion of the silicon oxide layer 15 and a portion of the copper layer 16 are removed by a chemical mechanical polishing (CMP) process until the interlayer dielectric layer 11 is exposed.

Figure 4:
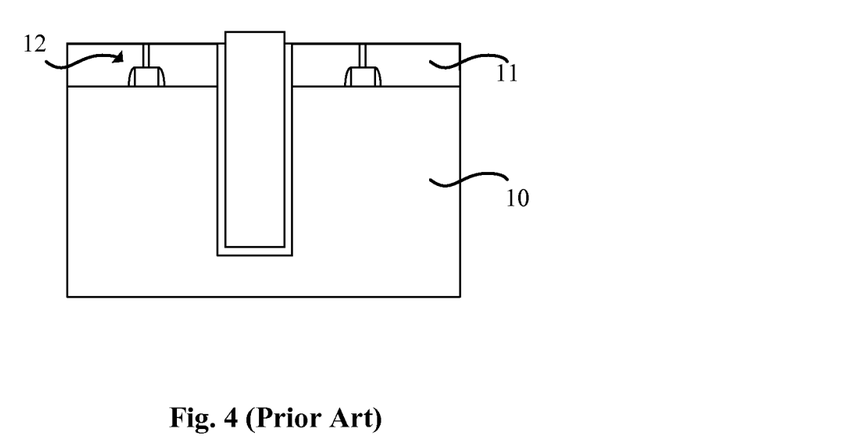

Specifically, the CMP process includes removing the copper layer 16 on the silicon oxide layer 15 until the silicon oxide layer 15 is exposed, and removing the silicon oxide layer 15 and the copper layer 16 by using the interlayer dielectric layer 11 as a stop layer. In the conventional TSV technique, the silicon oxide layer 15 is used to insulate the silicon substrate 10 from the copper layer 16. The silicon oxide layer 15 has generally a relatively large thickness ranging from about 1000 Å to about 2000 Å. As a result, the removal of the silicon oxide layer may takes a long period of time. However, in the CMP process, a removal rate of the silicon oxide layer 15 is larger than a removal rate of the copper layer 16. Therefore, when the CMP process is completed, the silicon oxide layer 15 on the interlayer dielectric layer 11 is completely removed, but the copper layer 16 may have an elevated surface that is protruded over the surface of the interlayer dielectric layer 11, so that a protruding portion is formed. The protruding portion may affect the performance of the TSV structure.

Therefore, there is a need to provide a method for forming a TSV structure that is capable of improving the performance of the TSV structure.

BRIEF SUMMARY OF THE INVENTION

Embodiments of the present invention provide a method for forming a TSV structure. In one embodiment, the method includes providing a silicon substrate, forming an interlayer dielectric layer on the silicon substrate, and forming a hard mask structure on the interlayer dielectric layer. The hard mask structure may include a first hard mask layer and a second hard mask layer that are subsequently formed on the interlayer dielectric layer. The first hard mask layer may include a metal element. The method further includes forming an opening through the hard mask structure and the interlayer dielectric layer, the opening has a bottom and sidewalls in the silicon substrate. The method also includes depositing an insulating layer on the hard mask structure and on the bottom and sidewalls of the opening, and subsequently removing the insulating layer on the hard mask structure and the second hard mask layer on the first hard mask layer until the first hard mask layer is exposed. In addition, the method includes filling a conductive material into the opening, and removing the conductive material and the first hard mask layer by a CMP process until the interlayer dielectric layer is exposed.

Optionally, the metal element may include tantalum, titanium, tantalum nitride, or titanium nitride.

Optionally, the first hard mask has a thickness ranging from about 50 Å to about 1000 Å.

Optionally, the insulating layer may include silicon oxide, silicon nitride, a ONO stack (which includes an oxide-nitride-oxide multilayer structure), hafnium oxide, or aluminum oxide. In an embodiment, the insulating layer has a thickness ranging from about 50 Å to about 600 Å.

Optionally, the insulating layer is formed by a plasma enhanced chemical vapor deposition (PECVD), sub-atmospheric chemical vapor deposition (SACVD), or atomic layer deposition (ALD).

Optionally, the insulating layer on the hard mask structure and the second hard mask layer on the first hard mask layer are subsequently removed by a dry etching process until the first hard mask is exposed. In an embodiment, the dry etching process includes fluorine.

Optionally, the conductive material is tungsten or copper.

In an embodiment, the method may further include depositing an adhesive material on the bottom and the sidewalls of the opening to form an adhesive layer before filling the conductive material into the opening. In an embodiment, the adhesive layer may include a double layer structure that includes a tantalum layer and a tantalum nitride layer disposed thereon. In another embodiment, the adhesive layer may include a double layer structure that includes a titanium layer and a titanium nitride layer disposed thereon.

Embodiments of the present invention have the following advantages over the conventional techniques. The first hard mask layer includes a metal element, so a removal rate of the first hard mask layer may be close to a removal rate of the conductive material (which may contain metal) in the opening. Therefore, the size of the protruding portion may be reduced, which may lead to an improvement of the performance of the TSV structure.

Further, the first hard mask layer has a relatively small thickness in order to reduce a time duration of the CMP process. Therefore, the size of the protruding portion may be reduced, which may improve the performance of the TSV structure.

BRIEF DESCRIPTION OF THE DRAWINGS

FIGS. 6 to 12b are schematic cross-sectional views of intermediate structures of a TSV structure, illustrating a method for forming a TSV structure according to an embodiment of the present invention.

DETAILED DESCRIPTION OF THE INVENTION

Although the present invention is disclosed hereinafter with reference to preferred embodiments, it also can be implemented in other different embodiments and those skilled in the art may modify and vary the embodiments without departing from the spirit and scope of the present invention. Therefore, the present invention should not be limited by the embodiments disclosed herein.

Figure 5:
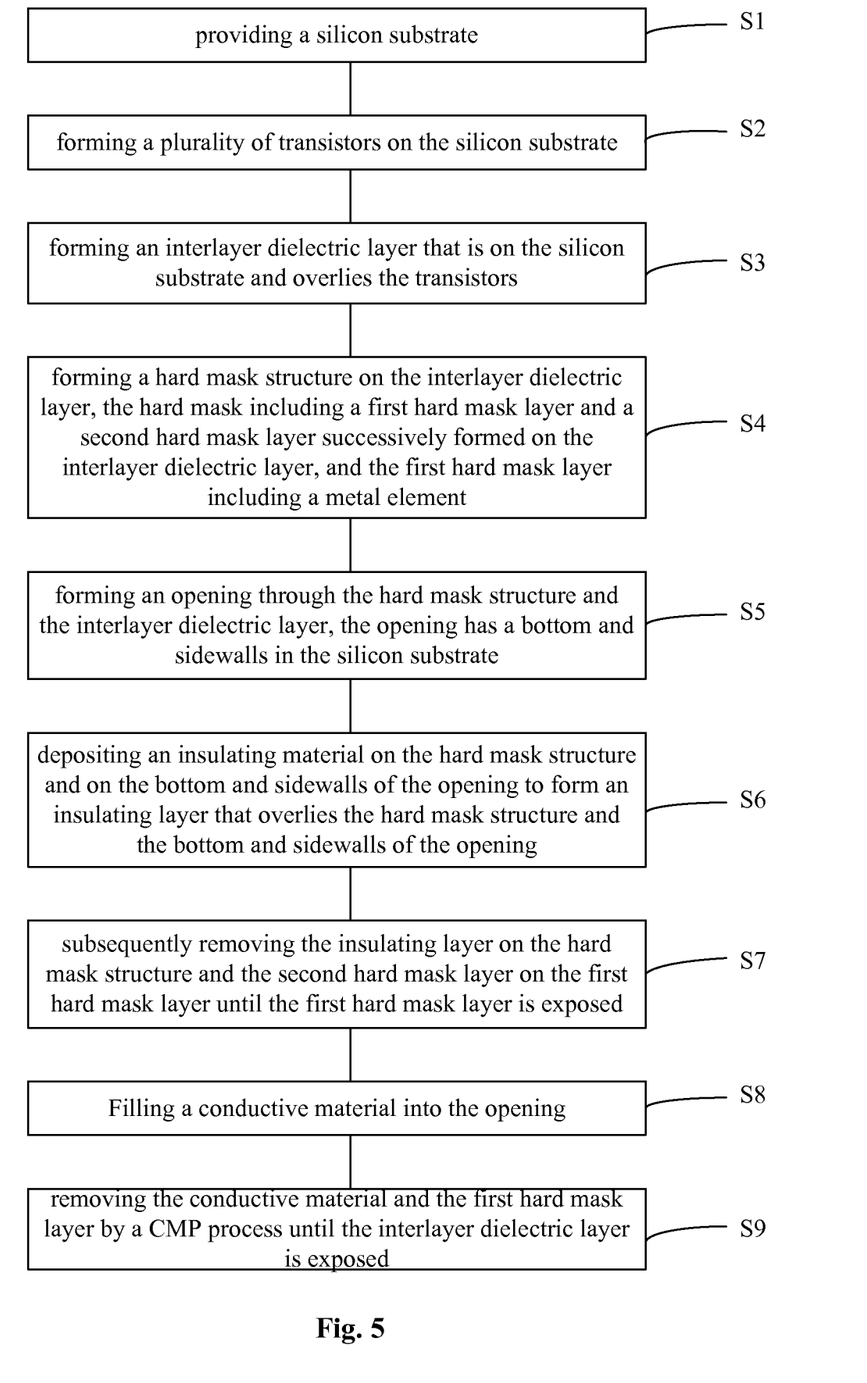
FIG. 5 is a flowchart of a method for forming a TSV structure according to an embodiment of the present invention.

Embodiments are described in detail hereinafter in conjunction with the accompanying drawings. FIG. 5 is a flowchart illustrating a method for forming a through-silicon-via (TSV) structure according to an embodiment of the present invention. As shown in FIG. 5, the method includes:

step S1: providing a silicon substrate;

step S2: forming a plurality of transistors on the silicon substrate;

step S3: forming an interlayer dielectric layer that is on the silicon substrate and on the transistors;

step S4: forming a hard mask structure on the interlayer dielectric layer, the hard mask structure including a first hard mask layer and a second hard mask layer subsequently formed on the interlayer dielectric layer, and the first hard mask layer including at least one material that includes metal element;

step S5: forming an opening through the hard mask structure and the interlayer dielectric layer, the opening has a bottom and sidewalls in the silicon substrate;

step S6: depositing a layer of an insulating material on the hard mask structure and on the bottom and the sidewalls of the opening to form an insulating layer that overlies the hard mask structure and the bottom and the sidewalls of the opening;

step S7: subsequently removing the insulating layer on the hard mask structure and the second hard mask layer on the first hard mask layer until the first hard mask layer is exposed;

step S8: filling a conductive material into the opening; and step S9: removing the conductive material and the first hard mask layer by a CMP process until the interlayer dielectric layer is exposed.

FIGS. 6 to 12b are schematic cross-sectional views of intermediate structures, illustrating a method for forming a TSV structure according to an embodiment of the present invention.

Figure 6:
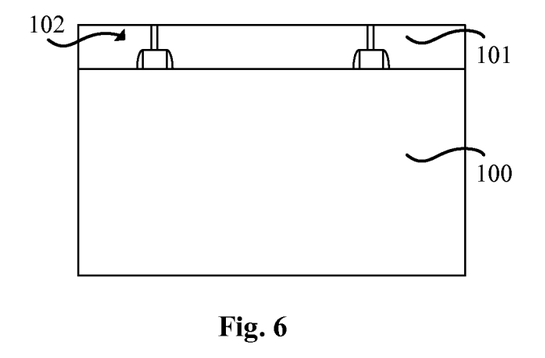

Referring to FIG. 6, steps S1 to S3 are performed. A silicon substrate 100 is provided, on which a plurality of transistors 102 are formed. An interlayer dielectric layer 101 is formed on the silicon substrate 100 and on the transistors 102. The transistors 102 can be interconnected via plugs with semiconductor devices that are subsequently formed on the interlayer dielectric layer 101. In an exemplary embodiment, the interlayer dielectric layer 101 includes silicon oxide.

Figure 7:
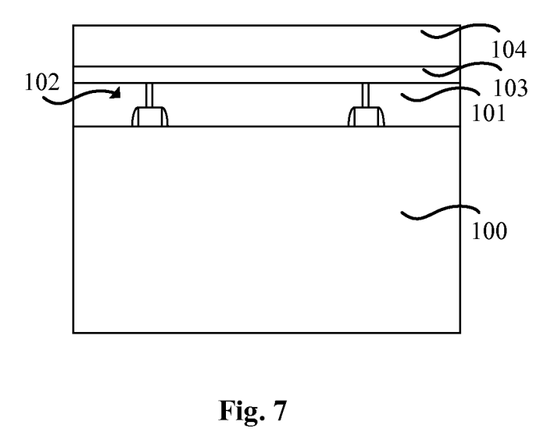

Referring to FIG. 7, step S4 is performed. A hard mask structure is formed on the interlayer dielectric layer 101. The hard mask structure may includes a first hard mask layer 103 and a second hard mask layer 104 that are subsequently formed on the interlayer dielectric layer 101. The first hard mask layer 103 includes a metal element. In an exemplary embodiment, the metal element may be tantalum, titanium, tantalum nitride or titanium nitride. The first hard mask layer 103 may have a thickness ranging from about 50 Å to about 1000 Å to reduce a time duration of a subsequent CMP process that will be performed in step S9.

In an exemplary embodiment, the second hard mask layer 104 includes silicon oxide and has a thickness ranging from about 0.3 μm to about 4 μm.

Figure 8:
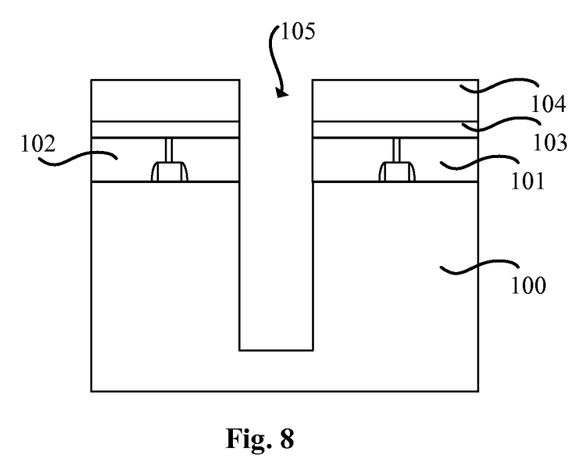

Referring to FIG. 8, step S5 is performed. An opening 105 is formed through the hard mask structure 103, 104 and the interlayer dielectric layer 101. The opening has a bottom and sidewalls in the silicon substrate 100. In a specific embodiment, the opening 105 can be formed by a dry etching process that includes the steps of forming a photoresist pattern corresponding to the opening on the hard mask structure, removing the photoresist pattern by etching, and dry etching the interlayer dielectric layer 101 and the silicon substrate 100 using the patterned hard mask structure as a mask to form the opening 105.

Figure 9:
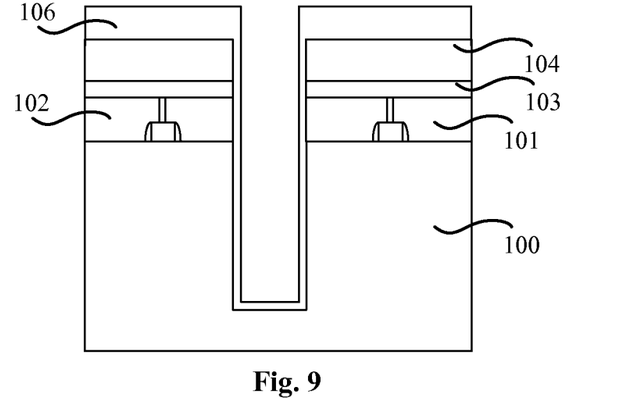

Referring to FIG. 9, step S6 is performed. An insulating layer 106 is formed by depositing an insulating material on the bottom and sidewalls of the opening 105, and on the hard mask structure. The insulating layer 106 can insulate the silicon substrate 100 and a conductive material that is subsequently filled into the opening 105.

In an exemplary embodiment, the insulating material may include silicon oxide, silicon nitride, an ONO stack (which includes an oxide-nitride-oxide multilayer structure), hafnium oxide or aluminum oxide.

The insulating layer 106 has a relatively small thickness which ranges from about 50 Å to about 600 Å. Therefore, in a preferable embodiment, the insulating layer 106 is formed by plasma enhanced chemical vapor deposition (PECVD), sub-atmospheric chemical vapor deposition (SACVD), or atomic layer deposition (ALD).

Figure 10A:
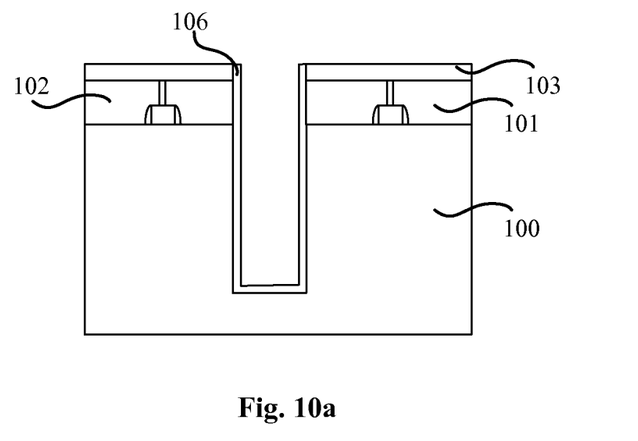

Referring to FIG. 10a, step S7 is performed. A portion of the insulating layer 106 on the hard mask structure and the second hard mask layer 104 on the first hard mask layer 103 are subsequently removed until the first hard mask layer 103 is exposed.

The insulating layer 106 on the hard mask structure and the second hard mask layer 104 can be removed by a dry etching process. In a specific embodiment, the dry etching process includes fluorine and only a portion of the first hard mask layer 103 will be removed.

It should be noted that, in order to prevent the bottom of the opening from being damaged in the dry etching process, in a preferable embodiment, an organic layer is formed on the insulating layer that covers at least the bottom of the opening before removing the insulating layer 106. The organic layer can protect the insulating layer on the bottom of the opening. In a specific embodiment, the organic layer can be formed by a spin coating process.

Figure 10B:
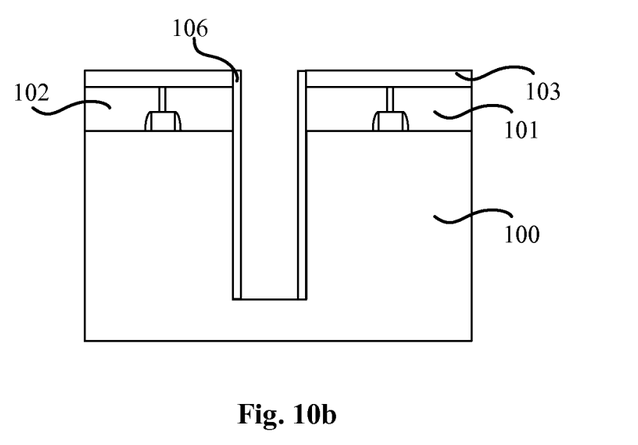

However, the scope of the invention should not be limited by the embodiments mentioned above. Alternatively, forming the organic layer can be omitted. Therefore, during the dry etching process, the insulating layer on the bottom of the opening is also removed, so that a surface of the silicon substrate 100 is exposed (as shown in FIG. 10b).

Figure 11A:
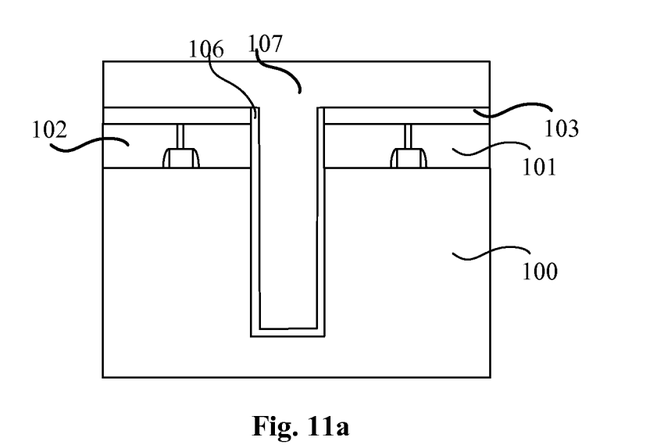

Referring to FIG. 11a, step S8 is performed. A conductive material is filled into the opening, which forms a conductive layer 107. In an exemplary embodiment, the conductive material may include tungsten or copper.

In an embodiment, before filling the conductive material into the opening, an adhesive layer is deposited on the bottom and the sidewalls of the opening. Therefore, the conductive layer 107 and the insulating layer 106 can have a better bonding. In an embodiment, the adhesive layer includes a double layer structure that contains a tantalum layer and a tantalum nitride layer formed thereon. In another embodiment, the adhesive layer includes a double layer structure that contains a titanium layer and a titanium nitride layer formed thereon.

Figure 11B:
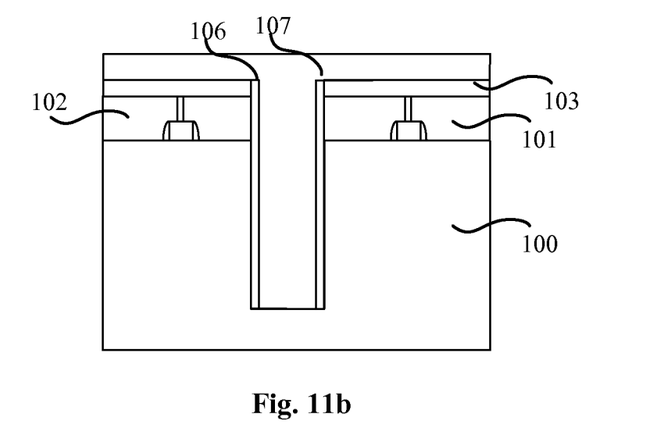

In an exemplary embodiment, the conductive layer 107 is formed on the insulating layer on the bottom of the opening (as shown in FIG. 11a). In an alternative embodiment, the insulating layer on the bottom of the opening is removed and the conductive layer 107 is formed directly on the exposed surface of the silicon substrate 100 (as shown in FIG. 11b).

Thereafter, step S9 is performed. The first hard mask 103 and a portion of the conductive layer 107 are removed by a CMP process until the interlayer dielectric layer 101 is exposed.

Figure 12A:
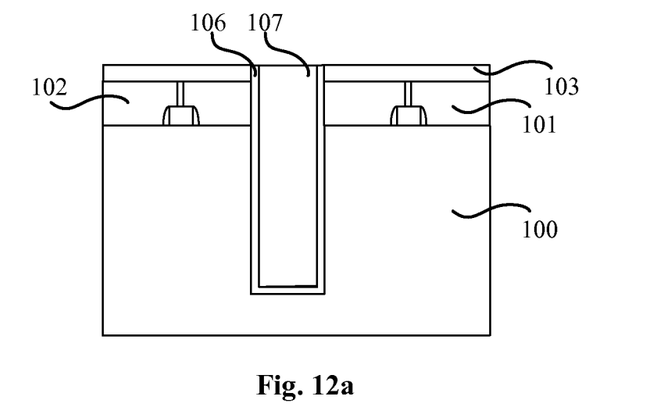

It should be noted that, after the conductive layer 107 is formed, the conductive material not only fills the opening completely, but also may overlie the first hard mask layer 103. Therefore, during the CMP method, the conductive material on the first hard mask layer 103 is removed until the first hard mask layer 103 is exposed (as shown in FIG. 12a). Thereafter, the first hard mask layer 103 is removed together with the conductive material in the opening by using the interlayer dielectric layer 101 as a stop layer (not shown). A removal rate of the first hard mask layer 103 and a removal rate of the conductive material are different, which may cause a formation of a protruding portion of the conductive layer 107 relative to the first hard mask layer 103. However, since the first hard mask layer 103 has a relatively small thickness, the time duration of the CMP process can be reduced. Therefore, the protruding portion formed herein is smaller than the protruding portion formed in the conventional technique.

Further, the first hard mask includes at least a metal element, and the conductive material filled into the opening includes a metal. Compared with the silicon oxide material applied in the conventional technique, the removal rate of the first hard mask is closer to the removal rate of the conductive material. The fact that both the first hard mask and the conductive material have similar removal rate will reduce the size of the protruding portion.

Figure 12B:
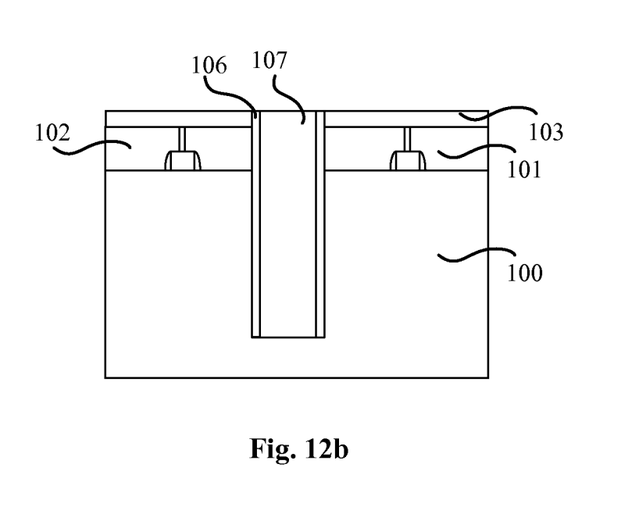

Similarly, in an alternative embodiment in which the insulating layer on the bottom of the opening is removed, the first hard mask 103 is removed until the first hard mask layer 103 is exposed (as shown in FIG. 12b). Thereafter, the first hard mask layer 103 is removed together with the conductive material in the opening by using the interlayer dielectric layer 101 as a stop layer (not shown).

Further, after the first hard mask layer is removed, other steps may also be included in the method for forming a TSV structure. For example, a second CMP process is performed on a back surface of the silicon substrate until the conductive layer 107 is exposed. Therefore, an electrical interconnection between layers is formed through the conductive layer 107 in the opening. The second CMP process or other steps are well known in the art and will not be described herein for the sake of brevity.

In conclusion, embodiments of the present invention provide a method for forming a TSV structure. The method can prevent or at least reduce the formation of a protruding portion of the conductive material in the opening when planarizing the interlayer dielectric layer. The method includes forming a first hard mask layer on the interlayer dielectric layer, the first hard mask layer has a thickness that is relatively small, e.g., 50 angstroms to 1000 angstroms, to reduce the time duration of the CMP process, and the first hard mask layer includes a metal element to obtain a removal rate that is closer to the removal rate of the conductive material (which includes a metal) in the CMP process. Therefore, the size of the protruding portion will be reduced, thereby improving the performance of the TSV structure.

Although the invention is disclosed in its preferred embodiments described above, many variations and modifications are possible therein and will be apparent to those skilled in the art after reading the foregoing description. It is therefore understood that the present invention may be presented otherwise without departing from the scope of thereof. Therefore, any simple modification, variation and polishing based on the embodiments described herein is within the scope of the present invention.

What is claimed is:

1. A method for forming a through-silicon-via (TSV) structure, the method comprising:
    providing a silicon substrate;
    forming an interlayer dielectric layer on the silicon substrate;
    forming a hard mask structure on the interlayer dielectric layer, the hard mask structure including a first hard mask layer overlying the interlayer dielectric layer, and a second hard mask layer overlaying the first hard mask layer, wherein the first hard mask layer is made of at least one material including a metal element;
    forming an opening through the hard mask structure and the interlayer dielectric layer, the opening having a bottom and sidewalls in the silicon substrate;
    depositing an insulating layer on the second hard mask that is on the first hard mask layer of the hard mask structure and on the bottom and the sidewalls of the opening;
    removing a portion of the insulating layer from the second hard mask layer and removing the second hard mask layer from the first hard mask layer to expose the first hard mask layer;
    filling a conductive material into the opening; and
    removing the conductive material and the first hard mask layer by a CMP process until the interlayer dielectric layer is exposed.

2. The method according to claim 1, wherein the metal element comprises tantalum, titanium, tantalum nitride, or titanium nitride.

3. The method according to claim 1, wherein the first hard mask has a thickness ranging from about 50 Å to about 1000 Å.

4. The method according to claim 1, wherein the insulating layer comprises silicon oxide, silicon nitride, an ONO stack, hafnium oxide, or aluminum oxide.

5. The method according to claim 1, wherein the insulating layer has a thickness ranging from about 50 Å to about 600 Å.

6. The method according to claim 1, wherein the insulating layer is formed by a plasma enhanced chemical vapor deposition, sub-atmospheric chemical vapor deposition, or atomic layer deposition.

7. The method according to claim 1, wherein the removing of the portion of the insulating layer from the second hard mask layer and the second hard mask layer from the first hard mask layer to expose the first hard mask layer comprises a dry etching process.

8. The method according to claim 7, wherein the dry etching process comprises fluorine.

9. The method according to claim 1, wherein the conductive material comprises tungsten or copper.

10. The method according to claim 1 further comprising depositing an adhesive material on the bottom and sidewalls of the opening to form an adhesive layer before filling the opening with the conductive material.

11. The method according to claim 10, wherein the adhesive layer comprises a double layer structure including a tantalum layer and a tantalum nitride layer formed thereon.

12. The method according to claim 10, wherein the adhesive layer comprises a double layer structure including a titanium layer and a titanium nitride layer formed thereon.

\* \* \* \* \*